(12) United States Patent
Kang et al.

(10) Patent No.: US 6,465,262 B2
(45) Date of Patent: Oct. 15, 2002

(54) METHOD FOR MANUFACTURING A SEMICONDUCTOR DEVICE

(75) Inventors: Chang-Yong Kang, Ichon-shi (KR); Young-Gwan Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/026,834

(22) Filed: Dec. 27, 2001

(65) Prior Publication Data
US 2002/0086448 A1 Jul. 4, 2002

(30) Foreign Application Priority Data
Dec. 28, 2000 (KR) .............................. 00-83819

(51) Int. Cl.$^7$ .............................................. H01L 21/00
(52) U.S. Cl. ........................... 438/3; 257/295; 365/173; 365/225.5
(58) Field of Search ............................ 438/3; 257/295; 365/173, 225.5

(56) References Cited
U.S. PATENT DOCUMENTS
6,114,719 A * 9/2000 Dill et al. .................... 257/295
6,183,859 B1 * 2/2001 Chen et al. ............... 204/192.2

FOREIGN PATENT DOCUMENTS
EP    1 085 586    *  3/2001
EP    1 109 170    *  6/2001

* cited by examiner

Primary Examiner—Trung Dang
(74) Attorney, Agent, or Firm—Jacobson Holman PLLC

(57) ABSTRACT

A method for manufacturing a semiconductor device capable of performing a writing operation with a small amount of current by forming a thin oxide film on the surface a word line being used as a write line so as to reduce the distance between an MTJ cell and the word line includes the steps of forming a word line on a semiconductor substrate, wherein the word line is used as a write line, forming a planarized layer insulating film exposing the surface of the word line, forming a dielectric film on the surface of the word line, forming a seed layer connected to the word line through the dielectric film and configuring a cell on the top of the seed layer and in an upper portion of the word line.

6 Claims, 2 Drawing Sheets

METHOD FOR MANUFACTURING A SEMICONDUCTOR DEVICE

FIELD OF THE INVENTION

The present invention relates to a method for manufacturing a semiconductor device; and, more particularly, to a method for manufacturing a magnetic random access memory (RAM) having characteristics of a non-volatile memory such as a flash memory, a faster speed than a static RAM and integration identical to that of a dynamic RAM.

BACKGROUND OF THE INVENTION

Most of semiconductor memory manufacturing companies are developing a magnetic RAM using ferromagnetic materials as one of the next generation memory devices.

The magnetic RAM is a memory device that is manufactured by forming a multi-layer of ferromagnetic thin films and reads and writes information by detecting a current variation according to the magnetization direction of each thin film. Therefore, the magnetic RAM can accomplish high speed, low power and high integration by using unique characteristics of a magnetic film, and perform the operation of a non-volatile memory, e.g., a flash memory.

The magnetic RAM employs a method for implementing a memory device by utilizing the spin polarization magnetic permeation phenomenon or the giant magnetoresistance (GMR) effect caused by the spin having a substantial influence on the propagation phenomenon of an electron.

The magnetic RAM implements a GMR magnetic memory device by using a phenomenon in which there is a big difference between the resistance when the spin directions of two magnetic layers are identical to each other, the two magnetic layers including a non-magnetic layer therebetween, and the resistance when the spin directions of the two magnetic layers are different from each other.

The magnetic RAM using the spin polarization magnetic permeation phenomenon embodies a magnetic permeation junction memory by utilizing a phenomenon in which the current permeation well occurs in the case in which the spin directions of two magnetic layers are identical to each other, the two magnetic layers including a dielectric layer therebetween, compared to the case in which the spin directions of the two magnetic layers are different from each other.

However, research on the magnetic RAM is in the early stage and is mainly concentrated on the formation of a multi-layer of magnetic thin films. Therefore, research on a unit cell structure and peripheral detecting circuits is deficient.

Referring to FIG. 1, there is shown a cross-sectional view of a conventional magnetic RAM device.

A gate electrode 33, i.e., a first word line, is formed on the top of a semiconductor substrate 31.

Then, source/drain junction regions 35a and 35b are formed inside the semiconductor substrate 31 on both sides of the first word line 33 and there are formed a ground line 37a and a first conductive layer 37b connected to the source/drain junction regions 35a and 35b, respectively. At this time, the ground line 37a is generated in the process of making the first conductive layer 37b.

Subsequently, there are formed a first layer insulating film 39 for planarization of the top surface of an intermediate product and a first contact plug 41 exposing the first conductive layer 37b.

There is patternized a lower lead layer 43 which is a second conductive layer and connected to the first contact plug 41.

A second layer insulating film 45 is formed to planarize the top surface of the intermediate product and, then, there is formed a second word line W/L2 being used as a write line 47 on the top of the second layer insulating film 45.

To planarize the top surface of the intermediate product including the write line 47, a third layer insulating film 48 is constructed thereafter.

A second contact plug 49 is formed to expose the second conductive layer 43.

Then, there is formed a seed layer 51 attached to the second contact plug 49. At this time, the seed layer 51 is made covering an upper portion of the second contact plug 49 and that of the write line 47.

Subsequently, a magnetic tunnel junction (MTJ) cell 100 is formed by sequentially stacking an antiferromagnetic layer (not shown), a pinned ferromagnetic layer 55, a tunnel junction layer 57 and a free ferromagnetic layer 59. The MTJ cell 100 has a pattern size identical to that of the write line 47 and is aligned with the write line 47.

Herein, the antiferromagnetic layer plays a role of keeping the magnetization direction of the pinned ferromagnetic layer unchanged, so that the magnetization direction of the tunnel junction layer 57 is fixed in one direction. Meanwhile, the free ferromagnetic layer 59 can store "0" or "1" information according to its magnetization direction when its magnetization direction is changed by an external magnetic field.

Finally, after forming a fourth layer insulating film 60 to planarize the top surface of the intermediate product and expose the free ferromagnetic layer 59, a bit line 61 is formed thereon.

Referring to FIG. 2, there is illustrated an enlarged cross-sectional view of a portion A in FIG. 1.

As shown in FIG. 2, the second word line W/L2 47 and the seed layer 51 maintain a distance "d" therebetween and the MTJ cell 100 is formed by stacking the pinned ferromagnetic layer 55, the tunnel junction layer 57 and the free ferromagnetic layer 59 on the top of the seed layer 51.

Herein, the distance "d" is made of the third layer insulating film 48 and has a size of about 1000 to about 2000 Å.

As described above, the conventional semiconductor device manufacturing method has a problem of requiring a lot of current to perform a writing operation since the distance between the seed layer and the second word line under the MTJ cell is too long.

SUMMARY OF THE INVENTION

It is, therefore, a primary object of the present invention to provide a method for manufacturing a semiconductor device capable of performing a writing operation with a small amount of current by forming a thin oxide film on the surface a second word line being used as a write line so as to reduce the distance between an MTJ cell and the second word line.

In accordance with the present invention, there is provided a method for manufacturing a semiconductor device, comprising the steps of:

(a) forming a word line on a semiconductor substrate, wherein the word line is used as a write line;

(b) forming a planarized layer insulating film exposing the surface of the word line;

(c) forming a dielectric film on the surface of the word line;

(d) forming a seed layer connected to the word line through the dielectric film; and (e) configuring a cell on the top of the seed layer and in an upper portion of the word line.

BRIEF DESCRIPTION OF THE DRAWINGS

The above and other objects and features of the instant invention will become apparent from the following description of preferred embodiments taken in conjunction with the accompanying drawings, in which.

DETAILED DESCRIPTION OF THE PREFERRED EMBODIMENTS

Hereinafter, an embodiment of the present invention will be described in detail with reference to the accompanying drawings.

Figure 2:
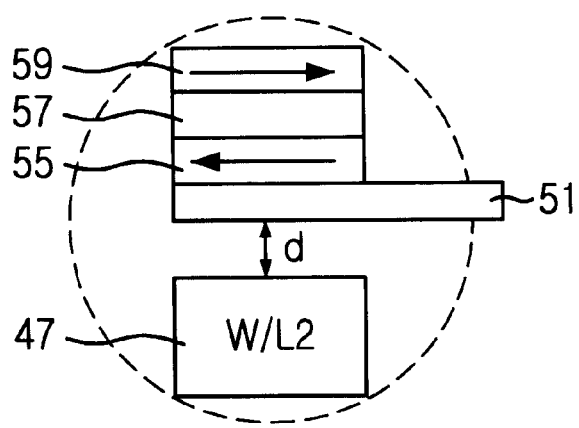
FIG. 2 shows an enlarged cross-sectional view of a portion A in FIG. 1.
Figure 3:
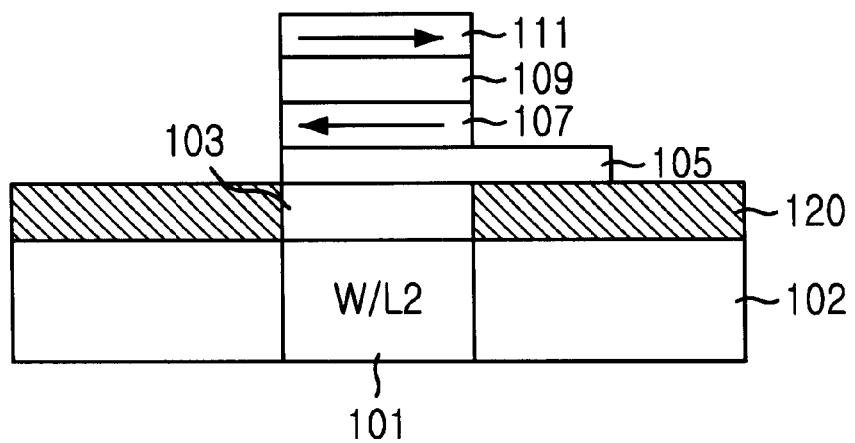
FIG. 3 illustrates a cross-sectional view of a part of a magnetic RAM in accordance with the present invention, which corresponds to the portion A shown in FIG. 2.

Referring to FIG. 3, there is illustrated a cross-sectional view of a part of a magnetic RAM in accordance with an embodiment of the present invention, which corresponds to the portion A described in connection with FIG. 2.

Figure 1:
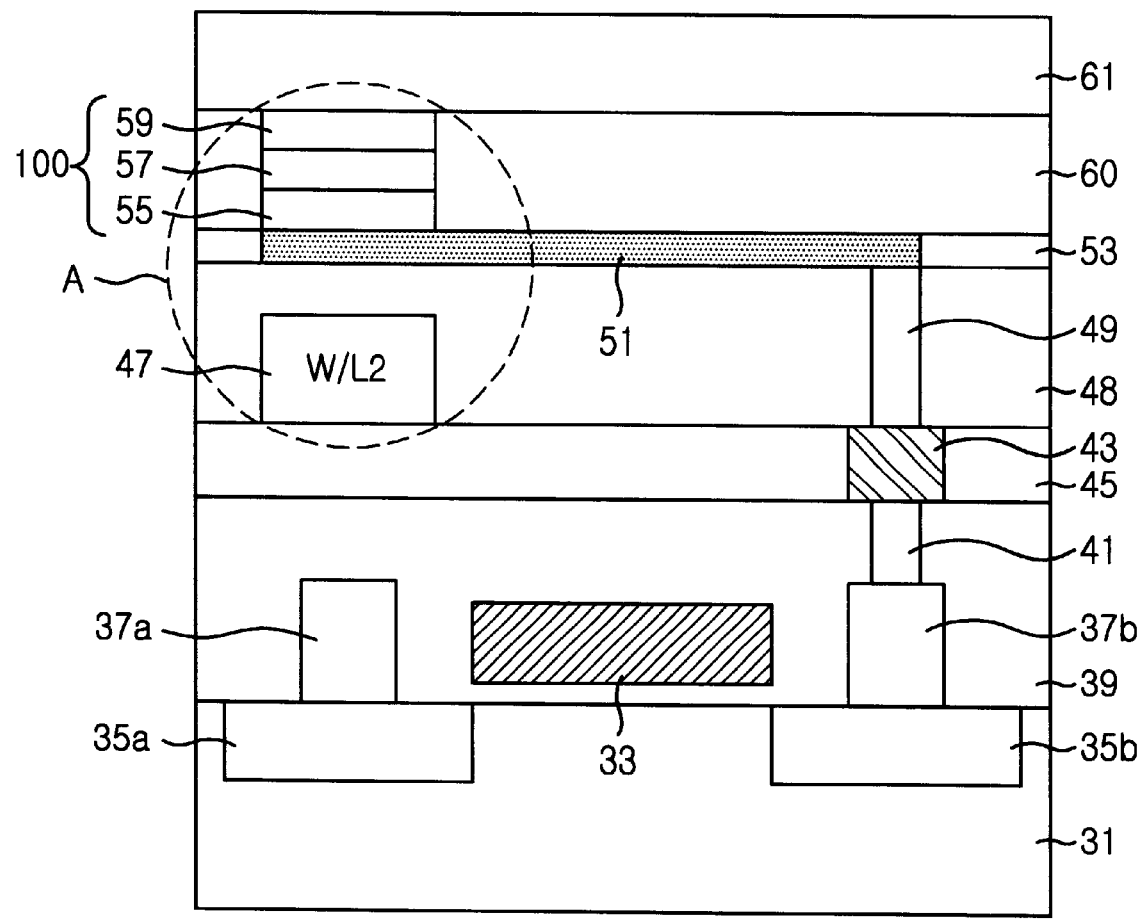
FIG. 1 shows a cross-sectional view of a conventional magnetic RAM.

First of all, a second word line W/L2 101 is formed on the top of the second layer insulating film 45 in FIG. 1.

At this time, the second word line W/L2 101 is made of tungsten, aluminum or copper, the surface of which is easily oxidized.

Then, a third layer insulating film 102 is formed to expose the surface of the second word line W/L2 101 by using a dielectric material having a low dielectric constant. That is, the third layer insulating film 102 is formed by covering the second word line W/L2 101 with the dielectric material and planarizing the dielectric layer covering the second word line W/L2 101 until the surface of the second word line W/L2 101 is exposed.

The exposed surface of the second word line W/L2 101 is oxidized to thereby form an oxide film 103 having a thickness of about 100 to about 500 Å.

The oxide film 103 can be substituted with other dielectric films such as a nitride film, alumina ($Al_2O_3$), etc., which have different dielectric constants from the oxide film 103. If the second word line W/L2 101 is made of copper, the surface of the second word line W/L2 101 is not easily oxidized because of the oxidative resistance of the copper. Therefore, at that time, instead of the oxide film 103 formed by oxidization, a chemical vapor deposition oxide film is formed on the surface of the second word line W/L2 101 through the use of CVD.

Herein, there is a great difference between the dielectric constant of the oxide film 103 and those of its neighboring dielectric films and, specifically, alumina has a higher dielectric constant than generally used layer insulating films.

Subsequently, a seed layer 105 is formed on the top of the oxide film 103 and in an upper portion of the second word line W/L2 101 and a MTJ cell is formed having a laminated structure of a pinned ferromagnetic layer 107, a tunnel junction layer 109 and a free ferromagnetic layer 111.

In the above, since the oxide film 103 is thin, it is possible to perform a writing operation with a small amount of current compared to the prior art since the distance between the MTJ cell and the second word line W/L2 101 can be reduced by employing the thin oxide film 103.

In accordance with another embodiment of the present invention, after completing the formation of the oxide film 103 and a planarized layer insulating film 120 exposing the surface of the oxide film 103, the seed layer 105 and the MTJ cell are formed on the planarized top surface.

As described above, in accordance with the present invention, there is provided an effect of improving the characteristics of a semiconductor device since the inventive method is capable of performing the writing operation using a small amount of current by forming the thin oxide film on the surface of the second word line so as to reduce the distance between the MTJ cell and the second word line being used as a write line. Since the distance can be reduced through the use of the thin oxide film, it is possible to easily change the spin direction in the MTJ cell with the small amount of current.

While the present invention has been described with respect to the particular embodiments, it will be apparent to those skilled in the art that various changes and modifications may be made without departing from the spirit and scope of the invention as defined in the following claims.

What is claimed is:

1. A method for manufacturing a semiconductor device, comprising the steps of:

(a) forming a word line on a semiconductor substrate, wherein the word line is used as a write line;

(b) forming a planarized layer insulating film exposing the surface of the word line;

(c) forming a dielectric film on the surface of the word line;

(d) forming a seed layer connected to the word line through the dielectric film; and (e) configuring a cell on the top of the seed layer and in an upper portion of the word line.

2. The method of claim 1, wherein the word line is made of a material selected from the group consisting of tungsten, aluminum and copper.

3. The method of claim 1, wherein the dielectric film has a thickness of about 100 to about 500 Å.

4. The method of claim 1, wherein the dielectric film is an oxide film made by oxidizing the surface of the word line.

5. The method of claim 1, wherein the dielectric film is one selected from the group consisting of alumina, a nitride film and a chemical vapor deposition (CVD) oxide film.

6. The method of claim 1 further comprising the step of forming a planarized layer insulating film exposing the surface of the dielectric film between the steps of (c) and (d).

* * * * *